United States Patent
Mitsuhashi et al.

(10) Patent No.: US 7,922,405 B2
(45) Date of Patent: Apr. 12, 2011

(54) DEVELOPING APPARATUS AND DEVELOPING METHOD

(75) Inventors: Tsuyoshi Mitsuhashi, Kyoto (JP); Kenji Sugimoto, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 942 days.

(21) Appl. No.: 11/671,581

(22) Filed: Feb. 6, 2007

(65) Prior Publication Data

US 2007/0183775 A1  Aug. 9, 2007

(30) Foreign Application Priority Data

Feb. 7, 2006 (JP) .................................. 2006-029963

(51) Int. Cl.
*G03D 5/00* (2006.01)
(52) U.S. Cl. ...................... 396/611; 396/564; 396/582
(58) Field of Classification Search .................. 396/611, 396/625, 628, 634, 635
See application file for complete search history.

(56) References Cited

U.S. PATENT DOCUMENTS

| | | | | |
|---|---|---|---|---|
| 4,093,121 A | * | 6/1978 | Strom | 239/117 |
| 4,460,128 A | * | 7/1984 | Lazarre | 239/533.1 |
| 5,854,953 A | * | 12/1998 | Semba | 396/611 |
| 7,486,377 B2 | * | 2/2009 | Kitano et al. | 355/27 |
| 2003/0003402 A1 | * | 1/2003 | Plat | 430/313 |
| 2003/0102385 A1 | * | 6/2003 | Nguyen | 239/398 |
| 2003/0196683 A1 | * | 10/2003 | Izumi et al. | 134/2 |
| 2004/0115567 A1 | * | 6/2004 | Mandal et al. | 430/324 |
| 2007/0065145 A1 | * | 3/2007 | Kitamura | 396/611 |
| 2007/0177869 A1 | | 8/2007 | Yamamoto et al. | |
| 2007/0221253 A1 | * | 9/2007 | Nishikido | 134/26 |
| 2009/0272407 A1 | * | 11/2009 | Nakamura et al. | 134/18 |

FOREIGN PATENT DOCUMENTS

| | | |
|---|---|---|
| JP | 5-226242 | 9/1993 |
| JP | 7-135137 | 5/1995 |
| JP | 07135137 A * | 5/1995 |
| JP | 2000-315643 | 11/2000 |
| JP | 2003-37035 | 2/2003 |
| JP | 2003-109894 | 4/2003 |
| JP | 2005-332882 | 12/2005 |
| KR | 0211252 | 4/2001 |
| WO | 2005/101467 | 10/2005 |

OTHER PUBLICATIONS

Machine translation of JP 07-135137A.*
Office Action dated May 8, 2009 issued in corresponding Chinese Patent Application No. 200710006223.9.
Office Action dated Feb. 26, 2008 for corresponding Korean Patent Application No. 10-2007-0010859 and English Language translation.
Taiwan Office Action dated Sep. 9, 2010 in connection with corresponding Taiwanese Patent Application No. 096104202.

* cited by examiner

Primary Examiner — Clayton E LaBalle
Assistant Examiner — Linda B Smith
(74) Attorney, Agent, or Firm — Ostrolenk Faber LLP

(57) ABSTRACT

A joint nozzle that delivers a developer, a rinsing liquid and nitrogen gas is disposed adjacent the spin center of a substrate in plan view. A controller operates electromagnetic switch valves to continue supply of the developer, while spinning the substrate, in a developing process, and to start supply of the rinsing liquid in a rinsing process, immediately after the supply of the developer ends, thereby achieving a shortened period of the developing process. A switching is made to a drying process by starting supply of the nitrogen gas immediately after completion of the rinsing process. Thus, even if the substrate has a large angle of contact, formation of droplets of the rinsing liquid is inhibited to prevent post-develop defects.

13 Claims, 12 Drawing Sheets

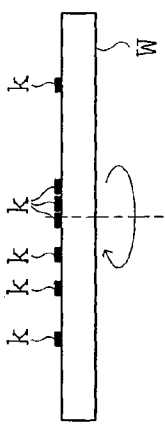
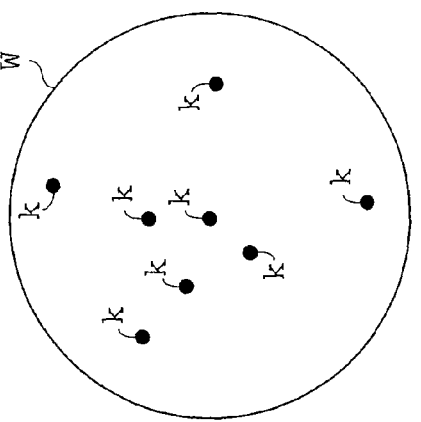
Fig.1C (PRIOR ART)
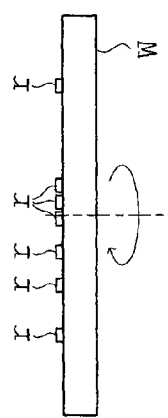
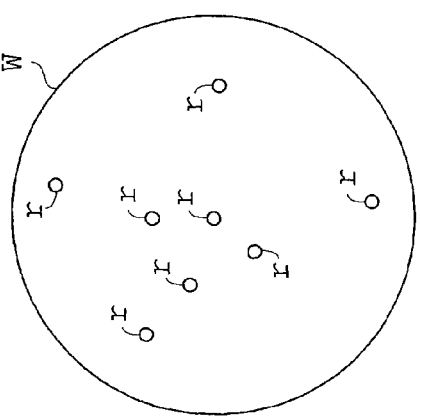
Fig.1B (PRIOR ART)
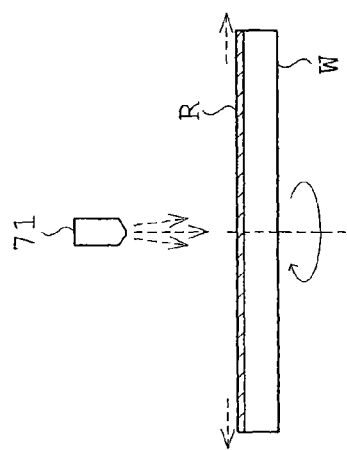
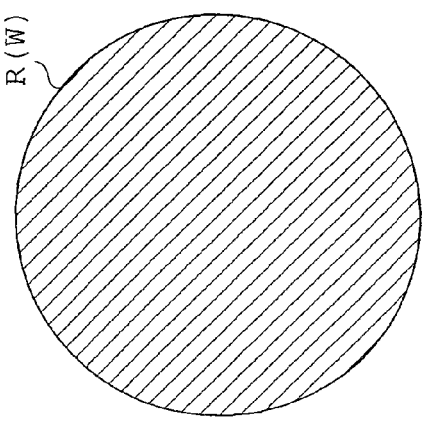
Fig.1A (PRIOR ART)

DEVELOPING APPARATUS AND DEVELOPING METHOD

BACKGROUND OF THE INVENTION (1) Field of the Invention

This invention relates to a developing apparatus and development method for developing semiconductor wafers, glass substrates for photomasks, glass substrates for liquid crystal displays and flat panel displays, and substrates for optical disks (hereinafter called simply "substrates").

(2) Description of the Related Art

As one of the methods of developing resist film formed on surfaces of substrates, a puddle development mode is used widely (as disclosed in Japanese Unexamined Patent Publication No. 2003-109894, for example). This developing mode may be divided broadly into a developing process, a rinsing process and a drying process as described below.

First, a developer is supplied while moving a developer nozzle relative to a substrate, to form a puddle of the developer on the substrate. In this state, the substrate is maintained still for a predetermined period to allow for progress of a development reaction (developing process). Subsequently, the substrate is spun while supplying a rinsing liquid (e.g. deionized water) to the substrate to stop the development reaction and clean the substrate (rinsing process). After the rinsing process, the supply of the rinsing liquid is stopped and the substrate is spun at high speed to dry (drying process).

For this purpose, a developing unit has a spin-support device for rotatably supporting a substrate, the developer nozzle, and a rinsing liquid nozzle. A developing apparatus includes a plurality of such developing units to develop substrates in parallel.

(I)

However, a conventional apparatus having the above construction has the following drawbacks.

The surface of a substrate to be developed has resist film formed thereon, and generally has a large angle of contact (which is an angle between the substrate surface and a tangent to each droplet), and thus has a strong tendency to repel liquid. As the wavelength of exposing machines has become shorter from i-beam to KrF, and from KrF to ArF, the angle of contact of the substrate is becoming larger according to a resist material used. Moreover, considering the resist to be used in immersion exposure expected to be implemented in the near future, the angle of contact is likely to become still larger.

When the angle of contact of the substrate becomes large, there arises an inconvenience that the substrate cannot not be dried effectively. This aspect will be described with reference to FIGS. 1A, 1B and 1C. FIGS. 1A-1C are front views and plan views of a substrate in a rinsing process and a drying process in the prior art. FIG. 1A shows a state of a rinsing liquid being supplied from a rinsing liquid nozzle 71 to a wafer W in a spin. As seen, the rinsing liquid supplied onto the wafer W flows from the center to edges of the wafer W to be discarded outward from the wafer W. At this time, a film R of the rinsing liquid is formed on the wafer W.

FIG. 1B shows a state of the supply of the rinsing liquid being stopped and the wafer W being spin-dried. Most of the rinsing liquid forming the film R is discarded outward from the wafer W, but part thereof deforms into droplets on the wafer W. In FIG. 1B, the droplets are shown with sign "r" affixed thereto. The larger angle of contact of the wafer W has the greater tendency to form the droplets "r" of the rinsing liquid. When the droplets "r" of the rinsing liquid are sufficiently small, the centrifugal force produced by the spinning wafer W may fail to act on the droplets "r" of the rinsing liquid, thereby allowing the droplets "r" to remain on the wafer W. The components of the resist will dissolve in the droplets "r" of the rinsing liquid remaining on the wafer W. This results in an inconvenience that, as shown in FIG. 1C, the components of the resist dissolved in the droplets "r" of the rinsing liquid form deposits, which become post-develop defects "k", on the wafer W having undergone a drying process.

(II)

The conventional method and apparatus have a drawback of requiring a long time for developing substrates. Among the respective processes of development, the developing process is the longest and takes up about a half of the total period of development. A development reaction which progresses in this developing process, specifically, is neutralization at development interfaces. With progress of the neutralization, the alkali concentration of the developer deteriorates (lowers). Consequently, the neutralization at the development interfaces slows down gradually. This deceleration is taken into consideration in determining a period for the developing process.

Since a long time is required for development, it is difficult to achieve a further improvement in the throughput of the developing apparatus. To increase the number of developing units in order to improve the throughput of the developing apparatus is unrealistic from the viewpoint of cost and footprint

SUMMARY OF THE INVENTION

This invention has been made having regard to the state of the art noted above, and its object is (I) to provide a developing apparatus and a developing method that can prevent generation of post-develop defects due to a large angle of contact of substrates, and (II) to provide a developing apparatus and a developing method for developing substrates in a reduced time.

The above object is fulfilled, according to this invention, by a developing apparatus for developing a substrate, comprising a spin-support device for rotatably supporting the substrate; a developer nozzle for supplying a developer to the substrate; a rinsing liquid nozzle for supplying a rinsing liquid to the substrate; an inert gas nozzle for supplying an inert gas to the substrate; and a control device for controlling spinning of the substrate and supply of the developer, the rinsing liquid and the inert gas; wherein the rinsing liquid nozzle and the inert gas nozzle are juxtaposed in a position adjacent a spin center of the substrate in plan view, and the control device starts supplying the inert gas to adjacent the spin center after supplying the rinsing liquid to adjacent the spin center of the substrate being spun, and while a film of the rinsing liquid is present on the substrate.

According to this invention, the rinsing liquid nozzle and inert gas nozzle are juxtaposed in a position adjacent the spin center of the substrate in plan view. Thus, the inert gas can be supplied to adjacent the spin center of the substrate, without displacing the rinsing liquid nozzle largely from adjacent the spin center of the substrate. The controller can therefore switch instantly what is supplied to adjacent the spin center of the substrate, from the rinsing liquid to the inert gas. Since the rinsing liquid and inert gas can be supplied to adjacent the spin center of the substrate substantially from right above, the rinsing liquid spreads over the substrate in concentric circles from adjacent the spin center, and drying of the substrate progresses in concentric circles from adjacent the spin center. In such construction, supply of the inert gas is started after supply of the rinsing liquid is stopped, and while the rinsing liquid remains in the form of film on the substrate surface. The inert gas supplied breaks the film of the rinsing liquid, and the substrate dries where the liquid film is broken. The term "adjacent the spin center of the substrate" is intended to mean also the spin center of the substrate.

Since the substrate is spinning, once the film of the rinsing liquid is broken, the broken portion will quickly enlarge toward edges of the substrate whereby the entire substrate will dry. In this way, the substrate changes from the state of having the film of the rinsing liquid formed thereon straight to the dried state. This allows no time for formation of droplets of the rinsing liquid. Thus, even if the substrate has a large angle of contact, there is no possibility of droplets of the rinsing liquid remaining on the substrate. It is also possible to prevent post-develop defects due to the components of resist dissolving in the rinsing liquid.

The apparatus according to this invention may further comprise a driving device for slightly moving the inert gas nozzle adjacent the spin center of the substrate in plan view. With this driving device, supply of the inert gas can be started by slightly moving the inert gas nozzle in a prompt way.

The driving device may be arranged to move slightly also the rinsing liquid nozzle adjacent the spin center of the substrate in plan view. With the driving device constructed for slightly moving also the rinsing liquid nozzle, the rinsing liquid nozzle can be displaced as well as the inert gas nozzle being moved. With the driving device being shared by the rinsing liquid nozzle and inert gas nozzle, the construction of the developing apparatus is simplified.

In this invention, the developer nozzle may also be juxtaposed adjacent the spin center of the substrate in plan view when the rinsing liquid nozzle is disposed adjacent the spin center of the substrate in plan view; and the control device may be arranged, while spinning the substrate, to switch instantly from the supply of the developer to adjacent the spin center to the supply of the rinsing liquid to adjacent the spin center. Since the developer nozzle and rinsing liquid nozzle are juxtaposed adjacent the spin center of the substrate in plan view, the rinsing liquid can be supplied to adjacent the spin center of the substrate without displacing the developer nozzle largely from adjacent the spin center of the substrate. The control device can therefore switch instantly what is supplied to adjacent the spin center of the substrate, from the developer to the rinsing liquid. Thus, while a new developer is continuously supplied to the substrate to prevent lowering the rate of development reaction, the supply of the developer can be stopped at a desired time. Since the substrate is kept spinning, the new developer spreads quickly over the entire substrate. The above construction can shorten the time required for developing the substrate, compared with the conventional puddle development mode.

In this invention, the rinsing liquid nozzle and the inert gas nozzle may be integrated with each other. Then, it is possible to realize conveniently the construction in which the rinsing liquid nozzle and inert gas nozzle are juxtaposed adjacent the spin center of the substrate in plan view, with each nozzle directed to the spin center of the substrate.

The developer nozzle may be integrated with the rinsing liquid nozzle and the inert gas nozzle. Then, it is possible to realize conveniently the construction in which the developer nozzle and rinsing liquid nozzle are juxtaposed adjacent the spin center of the substrate in plan view, with each nozzle directed to the spin center of the substrate.

In another aspect of the invention, a developing apparatus for developing a substrate, comprises a spin-support device for rotatably supporting the substrate; a developer nozzle for supplying a developer to the substrate; a rinsing liquid nozzle for supplying a rinsing liquid to the substrate; an inert gas nozzle for supplying an inert gas to the substrate; and a control device for controlling spinning of the substrate and supply of the developer, the rinsing liquid and the inert gas; wherein the rinsing liquid nozzle and the inert gas nozzle are juxtaposed as directed to adjacent a spin center of the substrate, and the control device starts supplying the inert gas to adjacent the spin center after supplying the rinsing liquid to adjacent the spin center of the substrate being spun, and while a film of the rinsing liquid is present on the substrate.

According to this invention, the rinsing liquid nozzle and inert gas nozzle are juxtaposed as directed to adjacent the spin center of the substrate. Thus, the inert gas can be supplied to adjacent the spin center of the substrate, without displacing the rinsing liquid nozzle largely from where the rinsing liquid nozzle has been supplying the rinsing liquid. The controller can therefore switch instantly what is supplied to adjacent the spin center of the substrate, from the rinsing liquid to the inert gas. In such construction, supply of the inert gas is started after supply of the rinsing liquid is stopped, and while the rinsing liquid remains in the form of film on the substrate surface. The inert gas supplied breaks the film of the rinsing liquid, and the substrate dries where the liquid film is broken. The term "adjacent the spin center of the substrate" is intended to mean also the spin center of the substrate.

Since the substrate is spinning, once the film of the rinsing liquid is broken, the broken portion will quickly enlarge toward edges of the substrate whereby the entire substrate will dry. In this way, the substrate changes from the state of having the film of the rinsing liquid formed thereon straight to the dried state. This allows no time for formation of droplets of the rinsing liquid. Thus, even if the substrate has a large angle of contact, there is no possibility of droplets of the rinsing liquid remaining on the substrate. It is also possible to prevent post-develop defects due to the components of resist dissolving in the rinsing liquid.

The developer nozzle may also be juxtaposed as directed to adjacent the spin center of the substrate when the rinsing liquid nozzle is disposed as directed to adjacent the spin center of the substrate, and the control device may be arranged, while spinning the substrate, to switch instantly from the supply of the developer to adjacent the spin center to the supply of the rinsing liquid to adjacent the spin center. Since the developer nozzle and rinsing liquid nozzle are juxtaposed as directed to adjacent the spin center of the substrate, the rinsing liquid can be supplied to adjacent the spin center of the substrate, without displacing the developer nozzle largely from where the developer nozzle has been supplying the developer. The controller can therefore switch instantly what is supplied to adjacent the spin center of the substrate, from the developer to the rinsing liquid. Thus, while a new developer is continuously supplied to the substrate to prevent lowering the rate of development reaction, the supply of the developer can be stopped at a desired time. Since the substrate is kept spinning, the new developer spreads quickly over the entire substrate. The above construction can shorten the time required for developing the substrate, compared with the conventional puddle development mode.

In a further aspect of the invention, a developing apparatus for developing a substrate, comprises a spin-support device for rotatably supporting the substrate; a developer nozzle for supplying a developer to the substrate; a rinsing liquid nozzle for supplying a rinsing liquid to the substrate; an inert gas nozzle for supplying an inert gas to the substrate; and a control device for controlling spinning of the substrate and supply of the developer, the rinsing liquid and the inert gas;

wherein the developer nozzle and the rinsing liquid nozzle are juxtaposed in a position adjacent a spin center of the substrate in plan view, and the control device is arranged, while spinning the substrate, to switch instantly from the supply of the developer to adjacent the spin center to the supply of the rinsing liquid to adjacent the spin center.

According to this invention, the developer nozzle and rinsing liquid nozzle are juxtaposed adjacent the spin center of the substrate. Thus, the rinsing liquid can be supplied to adjacent the spin center of the substrate, without displacing the developer largely from where the developer nozzle has been supplying the developer liquid. The controller can therefore switch instantly what is supplied to adjacent the spin center of the substrate, from the developer to the rinsing liquid. Since the developer and rinsing liquid can be supplied to adjacent the spin center of the substrate substantially from right above, the developer or rinsing liquid spreads over the substrate in concentric circles from adjacent the spin center. Thus, while a new developer is continuously supplied to the substrate to prevent lowering the rate of development reaction, the supply of the developer can be stopped at a desired time. Since the substrate is kept spinning, the new developer spreads quickly over the entire substrate. The above construction can shorten the time required for developing the substrate, compared with the conventional puddle development mode.

In a still further aspect of the invention, a developing method for developing a substrate is provided, the method comprising the steps of developing the substrate by supplying a developer to the substrate; rinsing the substrate by spinning the substrate while supplying a rinsing solution to the substrate; and drying the substrate by starting supply of an inert gas to adjacent a spin center of the substrate after finishing the rinsing step and while a film of the rinsing liquid is present on the substrate.

According to this invention, supply of the inert gas is started after supply of the rinsing liquid is stopped, and while the rinsing liquid remains in the form of film on the substrate surface. The inert gas supplied breaks the film of the rinsing liquid. The substrate dries where the liquid film is broken. Since the substrate is spinning, once the film of the rinsing liquid is broken, the broken portion will quickly enlarge toward edges of the substrate whereby the entire substrate will dry. In this way, the substrate changes from the state of having the film of the rinsing liquid formed thereon straight to the dried state, to be free from formation of droplets of the rinsing liquid. Thus, even if the substrate has a large angle of contact, there is no possibility of droplets of the rinsing liquid remaining on the substrate. It is also possible to prevent post-develop defects due to the components of resist dissolving in the rinsing liquid.

In the invention noted above, the developing step may continue supply of the developer until an end of a period allocated for the developing step; and the rinsing step may start supply of the rinsing liquid immediately after the supply of the developer ends. Since the developing step continuously supplies the developer, a new developer is constantly supplied to development interfaces to prevent lowering the rate of development reaction. This can shorten the time required for the developing step. The rinsing step starts supply of the rinsing liquid immediately after the supply of the developer ends. Thus, the developing step may be terminated instantly to prevent over-development, and to give way to the rinsing step. The above method can shorten the time required for developing the substrate.

The invention disclosed in this specification relates also to the following developing apparatus and developing method:

(1) A developing apparatus for developing a substrate, comprising a spin-support device for rotatably supporting the substrate; a developer nozzle for supplying a developer to the substrate; a rinsing liquid nozzle for supplying a rinsing liquid to the substrate; an inert gas nozzle for supplying an inert gas to the substrate; and a control device for controlling spinning of the substrate and supply of the developer, the rinsing liquid and the inert gas; wherein the rinsing liquid nozzle and the inert gas nozzle are juxtaposed in a position adjacent a spin center of the substrate in plan view, and the control device is arranged, while spinning the substrate, to switch instantly from the supply of the rinsing liquid to adjacent the spin center to the supply of the inert gas to adjacent the spin center.

According to the invention set out in paragraph (1) above, the rinsing liquid nozzle and inert gas nozzle are juxtaposed adjacent the spin center of the substrate in plan view. The control device can therefore switch instantly what is supplied to adjacent the spin center of the substrate, from the rinsing liquid to the inert gas. When the supply of the inert gas is started, the rinsing liquid remains in the form of film on the substrate surface although the supply of the rinsing liquid has stopped. Thus, the above apparatus has functions and effects similar to the apparatus recited in claim 1.

(2) A developing method for developing a substrate, comprising the steps of developing the substrate by supplying a developer to the substrate; rinsing the substrate by spinning the substrate while supplying a rinsing solution to the substrate; and drying the substrate by starting supply of an inert gas to adjacent a spin center of the substrate immediately after finishing the rinsing step.

According to the invention set out in paragraph (2) above, the rinsing liquid remains in the form of film on the substrate surface immediately after the rinsing step ends. In this state, the inert gas is supplied to adjacent the spin center of the substrate. Thus, the above method has functions and effects similar to the method recited in claim 19.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIGS. 1A-1C are front views and plan views of a substrate in a rinsing process and a drying process in the prior art;

DESCRIPTION OF THE PREFERRED EMBODIMENTS

A preferred embodiment of this invention will be described in detail hereinafter with reference to the drawings.

Figure 2:
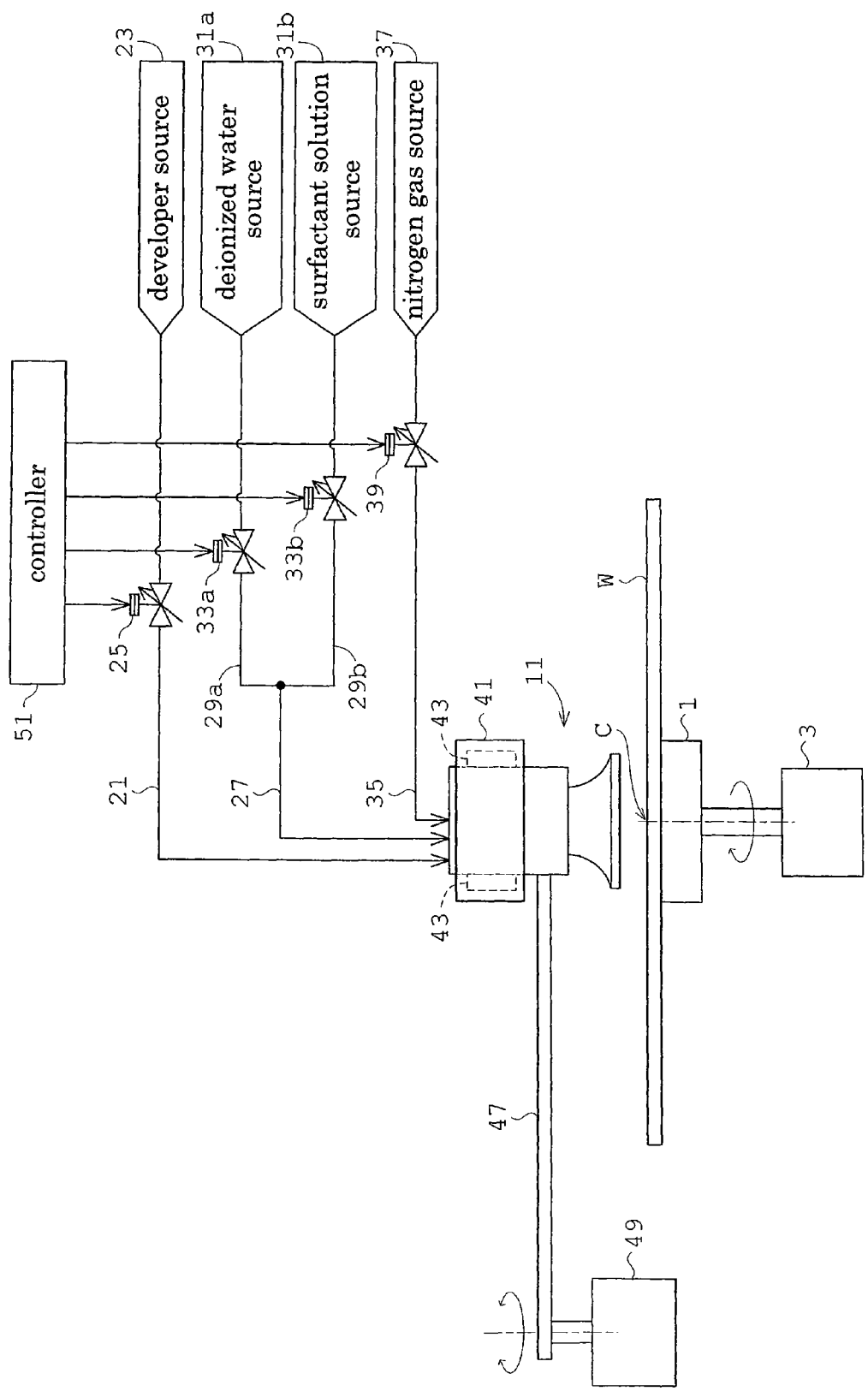
FIG. 2 is a view showing an outline of a developing apparatus according to this invention.
Figure 3A:
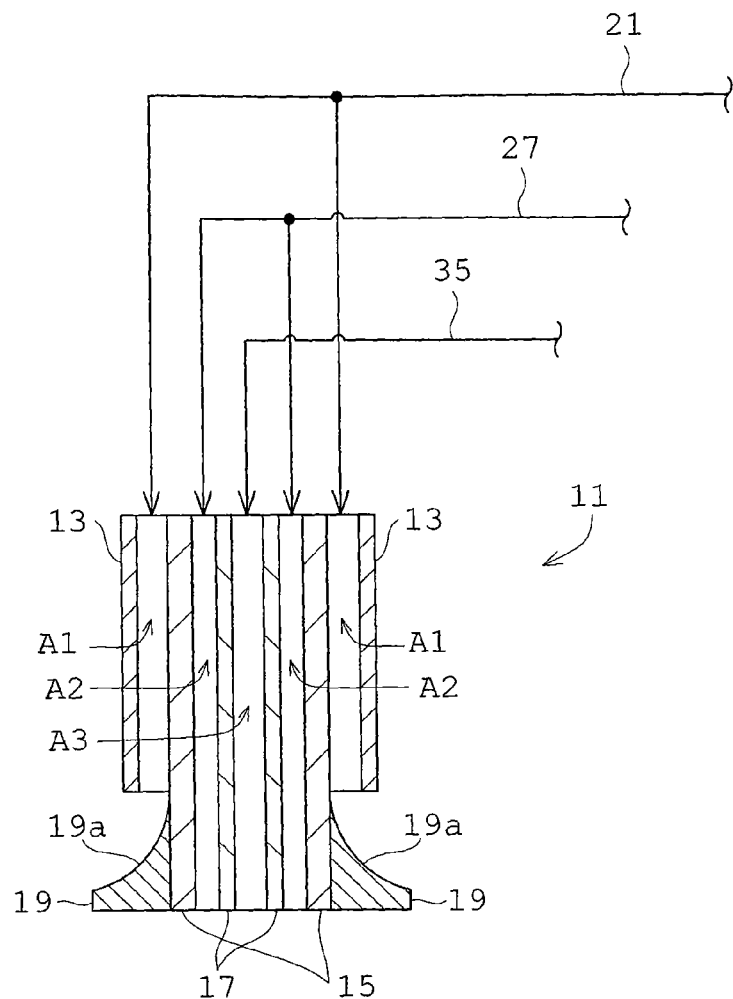
FIG. 3A is a view in vertical section of a joint nozzle.
Figure 3B:
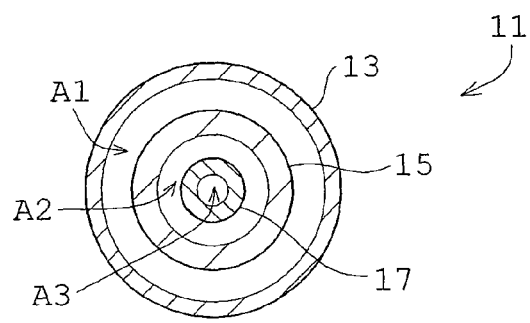
FIG. 3B is a view in cross section of the joint nozzle.

FIG. 2 is a view showing an outline of a developing apparatus according to this invention. FIG. 3A is a view in vertical section of a joint nozzle 11. FIG. 3B is a view in cross section of the joint nozzle 11.

The developing apparatus includes a spin chuck 1 for supporting, by suction, the lower surface of a wafer W in horizontal posture. The spin chuck 1 has a vertical output shaft of a first motor 3 connected to the lower end thereof. The first motor 3 spins the wafer W at a predetermined rotational frequency. At this time, the wafer W has a spin center C located on an extension of the output shaft of the first motor 3. The spin chuck 1 and first motor 3 correspond to the spin-support device in this invention.

The spin chuck 1 is surrounded by a cup (not shown) for collecting deionized water, a developer and so on scattering from the wafer W. The joint nozzle 11 is disposed above the spin chuck 1 for delivering nitrogen gas, a rinsing liquid and the developer.

Referring to FIGS. 3A and 3B, the joint nozzle 11 has a triple-tube structure including a cylindrical outer tube 13, a cylindrical intermediate tube 15 inserted in the hollow of the outer tube 13, and a cylindrical inner tube 17 inserted in the hollow of the intermediate tube 15. These outer tube 13, intermediate tube 15 and inner tube 17 have a common central axis. The intermediate tube 15 and inner tube 17 have lower ends extending to the same position in front view, while the outer tube 13 has a lower end thereof stopping short above the lower ends of the intermediate tube 15 and inner tube 17.

The intermediate tube 15 has, attached to a lower portion thereof projecting downward from the lower end of the outer tube 13, a liquid baffle 19 for mitigating a shock of the developer striking the wafer W. The liquid baffle 19 is shaped annular in plan view, and has an upper surface 19a thereof sloping down toward its outer peripheries. The upper surface 19a is curved to have a greater inclination toward the outer peripheries.

A space (hereinafter called "the first space") A1, shaped annular in plan view, and defined between the inner peripheral surface of the outer tube 13 and the outer peripheral surface of the intermediate tube 15, serves as a passage of the developer in the joint nozzle 11. One end of developer piping 21 is connected above the first space A1, and a lower plane of the first space A1 serves as a discharge opening.

Similarly, a space (hereinafter called "the second space") A2, shaped annular in plan view, and defined between the inner peripheral surface of the intermediate tube 15 and the outer peripheral surface of the inner tube 17, serves as a passage of the rinsing liquid in the joint nozzle 11. One end of rinsing liquid piping 27 is connected above the second space A2, and a lower plane of the second space A2 serves as a discharge opening.

The hollow (hereinafter called "the third space") A3 of the inner tube 17 serves as a passage of nitrogen gas in the joint nozzle 11. One end of nitrogen gas piping 35 is connected above the third space A3, and the lower plane of the third space A3 serves as a discharge opening.

When the joint nozzle 11 is located right over the spin center C of the wafer W, the above first space A1, second space A2 and third space A3 are arranged in concentric circles adjacent the spin center C of the wafer W. In substance, a developer nozzle, a rinsing liquid nozzle and a nitrogen gas nozzle are arranged one outside another, in plan view, adjacent the spin center C of the wafer W. It is therefore possible to supply any one of the developer, rinsing liquid and nitrogen gas adjacent the spin center C of the wafer W. The joint nozzle 11 corresponds to a construction integrating the developer nozzle, rinsing liquid nozzle and inert gas nozzle in this invention.

FIG. 2 refers again. A developer source 23 is connected to the other end of the developer piping 21. The developer source 23 is a container storing the developer, and is installed in this apparatus. These developer piping 21 and developer source 23 function as a developer supplying device. The developer piping 21 has an electromagnetic switch valve 25 mounted thereon.

Two branch pipes 29a and 29b are connected to the other end of the rinsing liquid piping 27, which are connected to a deionized water source 31a and a surfactant solution source 31b, respectively. The deionized water source 31a may be provided as a utility in a cleanroom, for example. The surfactant solution source 31b is a weighing tank for mixing a surfactant and deionized water in a predetermined ratio. In this specification, deionized water and surfactant solution are collectively called the "rinsing liquid." These rinsing liquid piping 27, branch pipes 29a and 29b, deionized water source 31a and surfactant solution source 31b function as a rinsing liquid supplying device. The branch pipes 29a and 29b have electromagnetic switch valves 33a and 33b mounted thereon, respectively.

A nitrogen gas source 37 is connected to the other end of the nitrogen gas piping 35. The nitrogen gas source 37 may be provided as a utility in the cleanroom. These nitrogen gas piping 35 and nitrogen gas source 37 function as a nitrogen gas supplying device. The nitrogen gas piping 35 has an electromagnetism switch valve 39 mounted thereon.

An upper portion of the joint nozzle 11 is covered with a housing 41. The housing 41 contains a Peltier device 43 having both functions of heat radiation and heat absorption for heating or cooling the outer tube 13 of joint nozzle 11. This adjusts, en bloc, the temperatures of the developer in the first space A1 and the rinsing liquid in the second space A2 of joint nozzle 11. The housing 41 and Peltier device 43 correspond to the temperature control device in this invention.

One end of an arm 47 is connected to a lateral position of the joint nozzle 11, and the other end thereof is connected to a vertical rotary shaft of a second motor 49. The joint nozzle 11 is driven by the second motor 49 to swing back and forth between a standby pod (not shown) disposed in a position offset from the wafer W and a position adjacent the spin center C of the wafer W in plan view.

A controller 51 performs an overall control of the first motor 3, second motor 49, electromagnetic switch valves 25, 33a, 33b and 39, and Peltier device 43. The controller 51 is realized by a central processing unit (CPU) for performing various processes, a RAM (Random-Access Memory) used as workspace of computations, and a storage medium such as a fixed disk for storing a variety of information. The controller 51 corresponds to the control device in this invention.

Figure 4:
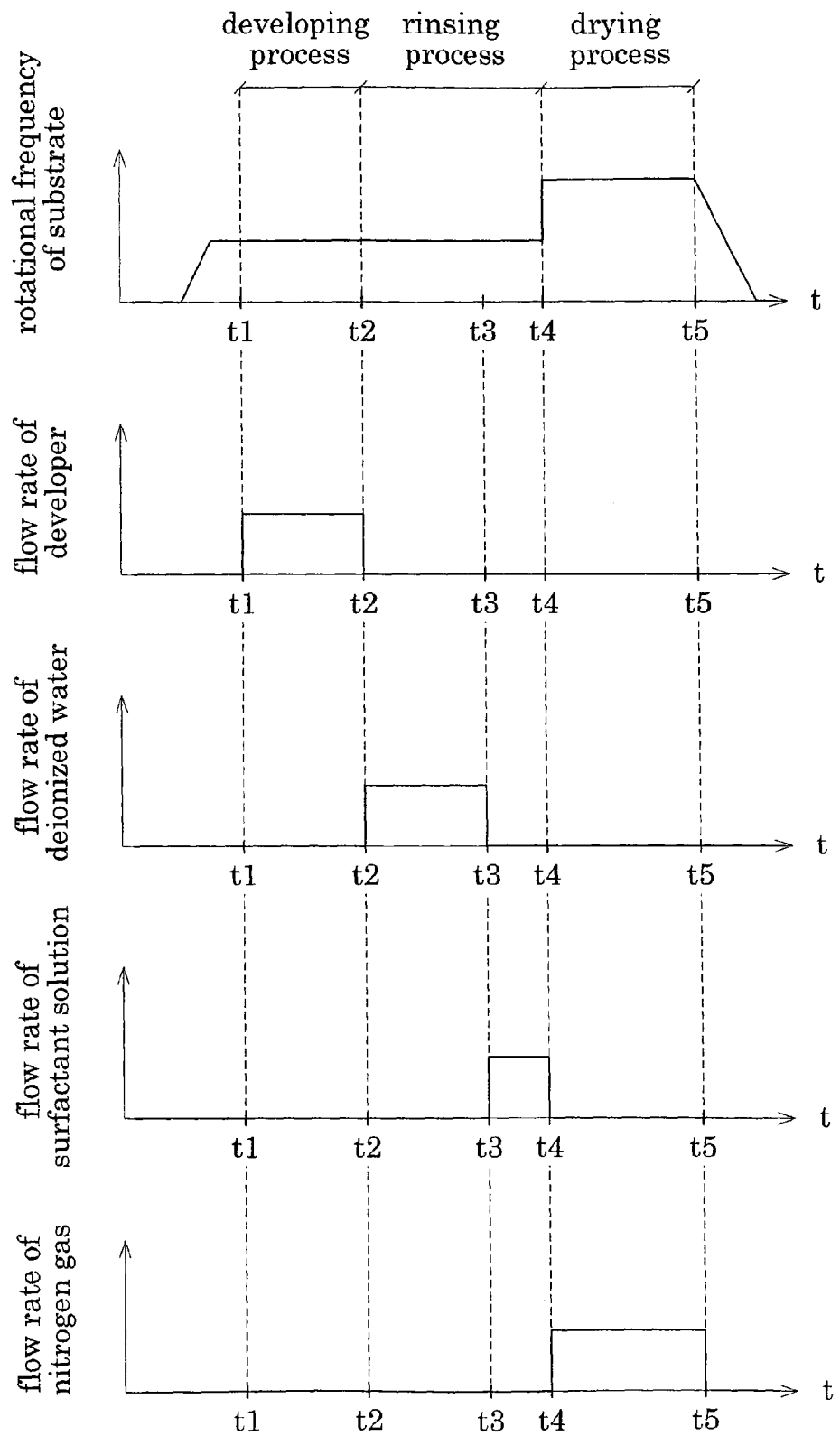
FIG. 4 is a timing chart showing a procedure of developing a substrate.

Next, operation of the developing apparatus will be described with reference to the drawings. FIG. 4 is a timing chart showing a procedure of developing a substrate. Since developing treatment is divided broadly into a developing process, a rinsing process and a drying process as shown in FIG. 4, each process will be described separately hereinafter. It is assumed that amounts of heat radiation and heat absorption by the Peltier device 43 are controlled so that the developer and rinsing liquid in the joint nozzle 11 become a predetermined temperature.

<Developing Process: Time t1-Time t2>

When an exposed wafer W having photoresist film formed on the surface thereof is transported into the developing apparatus, the wafer W is supported in horizontal posture on the spin chuck 1 by suction. Subsequently, the controller 51 starts the first motor 3 to spin the wafer W at a predetermined rotational frequency (several hundred rpm to several thousand rpm).

Then, the controller 51 operates the second motor 49 to swing horizontally the joint nozzle 11 from the standby pot (not shown) to adjacent the spin center C of the wafer W, and keep the joint nozzle 11 standing still there. While this swinging movement is conducted, the controller 51 opens the electromagnetic switch valve 25 having been closed, to direct the developer from the developer source 23 through the developer piping 21 to the joint nozzle 11. The incoming developer flows through the first space A1 in the joint nozzle 11, is adjusted to the predetermined temperature, and delivered from the lower plane of the first space A1. The developer delivered collides with the upper surface 19a of the liquid baffle 19 over the entire circumference thereof, then flows down the slope formed on the upper surface 19a, and falls from the entire circumference of the edges of the liquid baffle 19.

The falling developer is first supplied to the edges of the wafer W in accordance with the swing of the joint nozzle 11. After the joint nozzle 11 has moved to adjacent the spin center C of the wafer W in plan view and has stood still, and until time t2, the developer continues to be supplied to adjacent the spin center C of the wafer W.

Figure 5:
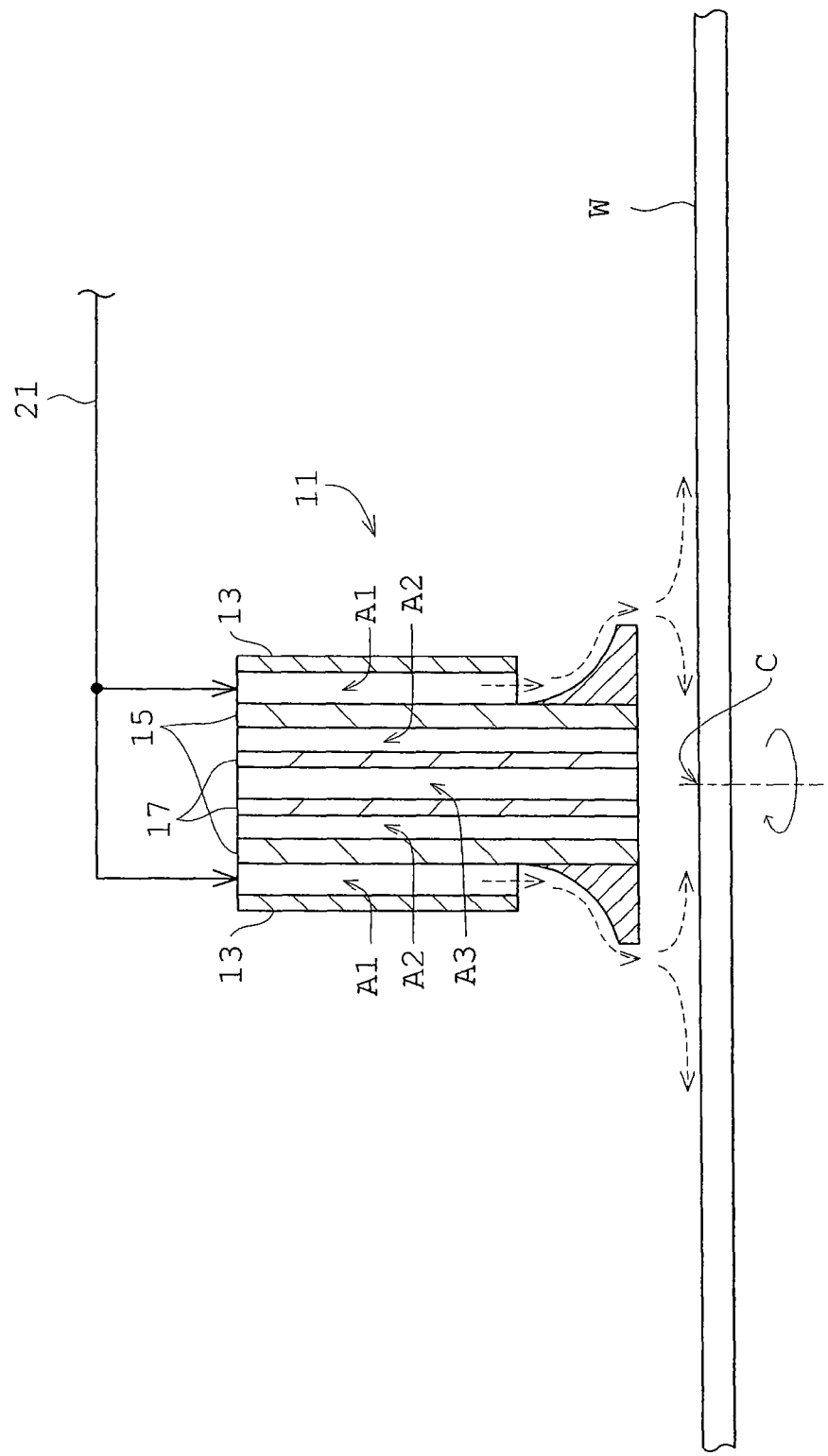
FIG. 5 is a schematic view showing a state of supplying a developer from the joint nozzle to the substrate.

FIG. 5 refers. FIG. 5 is a schematic view showing a state of supplying the developer from the joint nozzle 11 to the wafer W. As seen, when the developer falling from the entire circumference of the edges of the liquid baffle 19 lands on the wafer W, the developer will, under a centrifugal force, flow and spread out over the wafer W. Part of the developer will flow also inward from landing positions. The developer is scattered from the edges of the wafer W.

Thus, the wafer W constantly has a new supply of developer circulating thereon. Since no deterioration occurs with the alkali concentration of the developer, the rate of development reaction (neutralization) is maintained high throughout the developing process.

Figure 6:
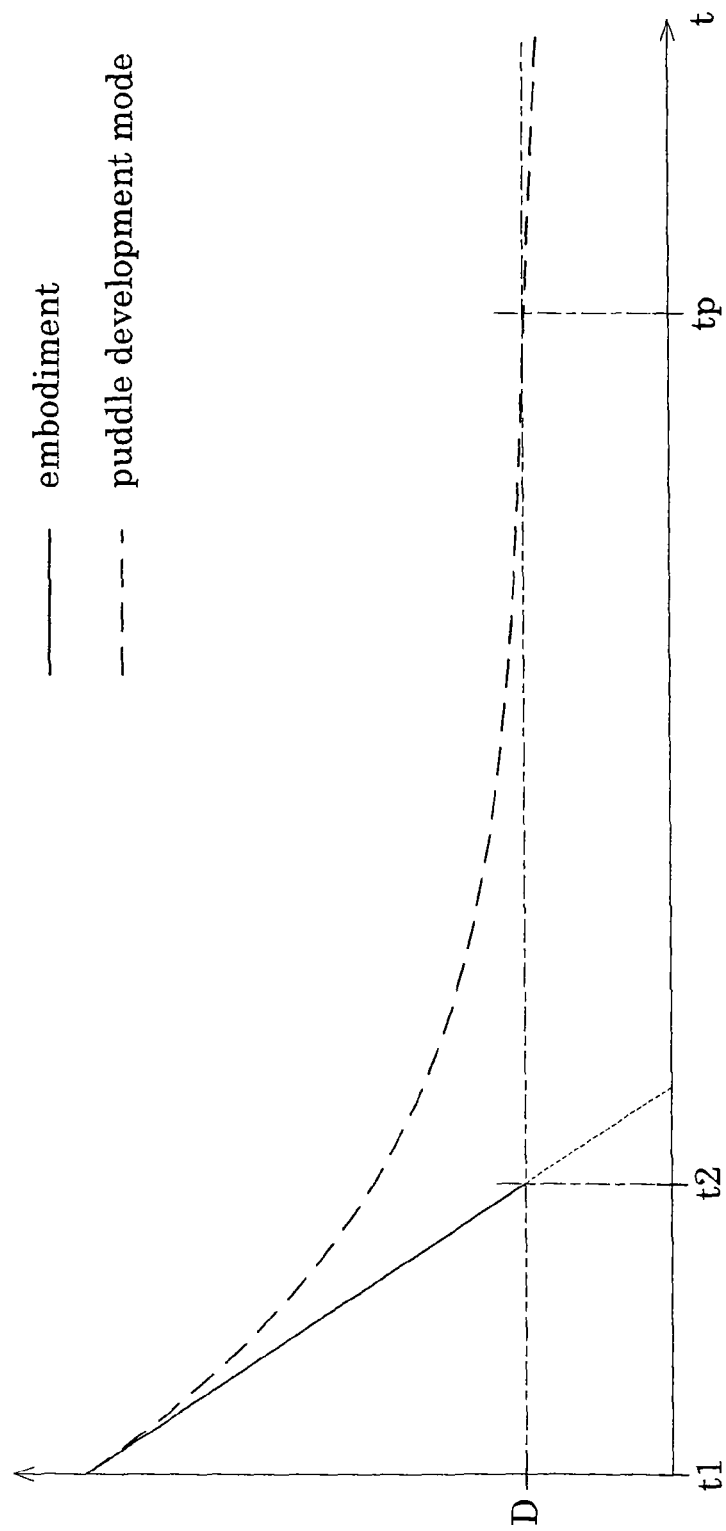
FIG. 6 is a schematic view showing a relationship between line width of a developed pattern and time as compared with a conventional puddle development mode.

FIG. 6 is a schematic view showing a relationship between line width (CD: Critical Dimension) of a developed pattern and time, as compared with the conventional puddle development mode. In FIG. 6, the solid line represents this embodiment, and the dotted line the conventional puddle development mode. Sign D in FIG. 6 indicates a desired value of line width. As seen, at development starting time t1, the line width of the developed pattern has the same rate of decrease for this embodiment and the conventional puddle development mode. That is, the rate of development reaction is the same. However, while no time-dependent change occurs in the rate of decrease of the line width of the developed pattern for this embodiment, the rate of decrease of the line width of the developed pattern falls with time for the conventional puddle development mode. Thus, this embodiment, compared with the puddle development mode, can decrease the line width of the developed pattern to the desired value D in a short time.

<Rinsing Process (1): Time t2-Time t3>

At time t2, the controller 51 closes the switch valve 25 from the open state, and opens the switch valve 33a from the closed state. The first motor 3 is continuously operated to spin the wafer W at the predetermined rotational frequency.

Consequently, the supply of the developer to the wafer W is stopped. Deionized water is directed from the deionized water source 31a into the joint nozzle 11. The deionized water flows through the second space A2, is adjusted to the predetermined temperature, and delivered from the lower plane of the second space A2.

Figure 7:
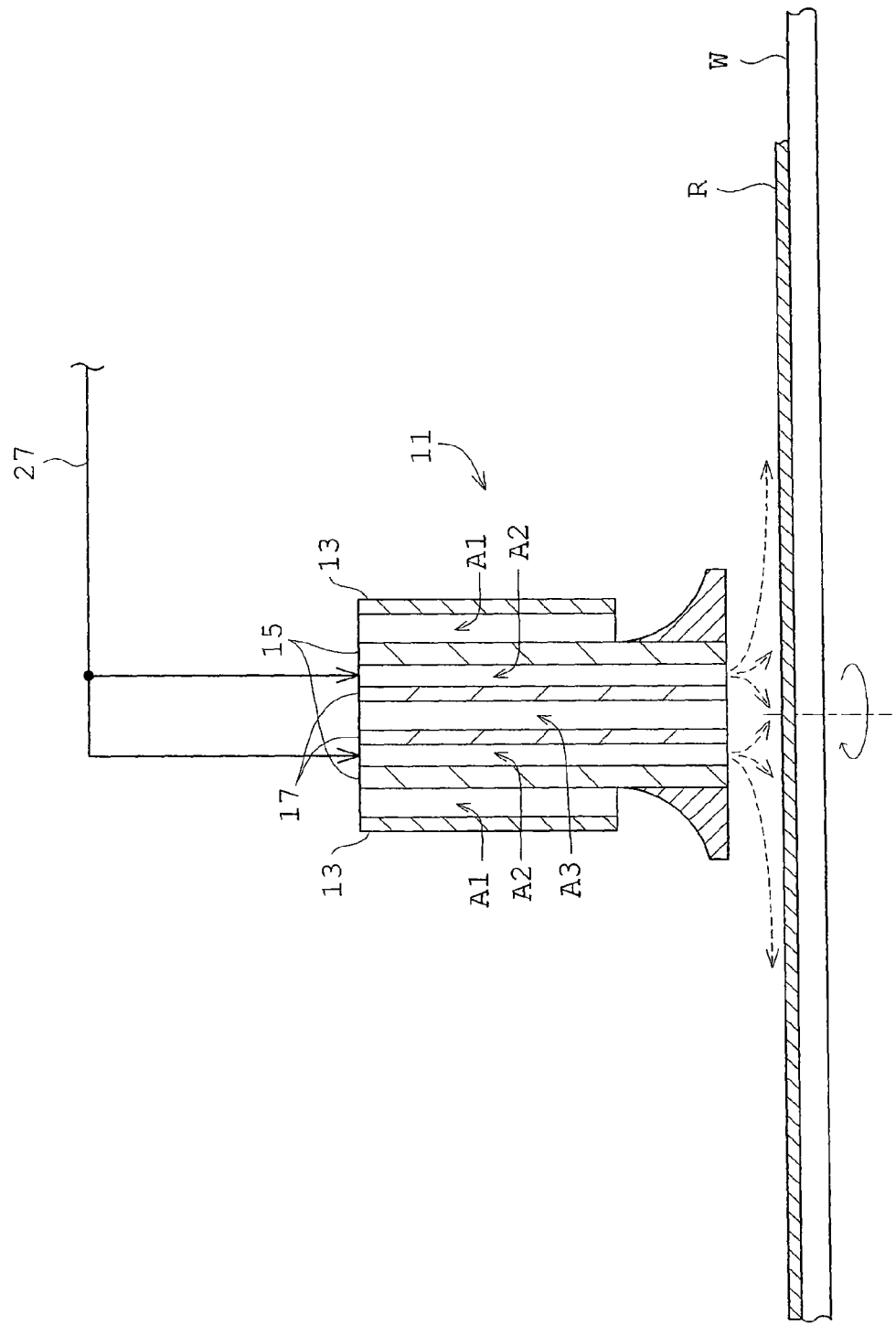
FIG. 7 is a schematic view showing a state of supplying deionized water from the joint nozzle to the substrate.

FIG. 7 is a schematic view showing a state of supplying the deionized water from the joint nozzle 11 to the wafer W. The deionized water delivered falls straight to the wafer W and, under a centrifugal force, flows and spreads out over the wafer W. As a result, the deionized water forms a film R on the wafer W. Part of the deionized water will flow also inward from landing positions. The deionized water is scattered from the edges of the wafer W.

By replacing the developer present on the wafer W with the deionized water as described above, the development reaction is stopped instantly. Consequently, as shown in FIG. 6, the development reaction can be stopped properly at a selected time when the line width of the developed pattern attains the desired value D.

<Rinsing Process (2): Time t3-Time t4>

At time t3, the switch valve 33a in the open state is closed, and the switch valve 33b in the closed state is opened.

This effects a switching from the deionized water to the surfactant solution. As is the deionized water, the surfactant solution is delivered from the lower plane of the second space A2 after undergoing the temperature control. The surfactant solution delivered flows over the wafer W, whereby a film of surfactant solution is formed on the wafer W. For expediency, the same sign "R" as the film R of deionized water is affixed to the film of surfactant solution.

<Drying Process: Time t4-Time t5>

At time t4, the controller 51 operates the first motor 3 to spin the wafer W at an increased rotational frequency. The controller 51 also closes the switch valve 33b from the open state, and opens the switch valve 39 from the closed state.

Consequently, the supply to the wafer W of the surfactant solution is stopped. Nitrogen gas is directed from the nitrogen gas source 37 into the joint nozzle 11, jetted down from the lower plane of the third space A3. The jetting of the nitrogen gas is started immediately after the supply to the wafer W of the surfactant solution is stopped. Thus, the film R of the surfactant solution still remains over the entire surface of the wafer W.

Figure 8:
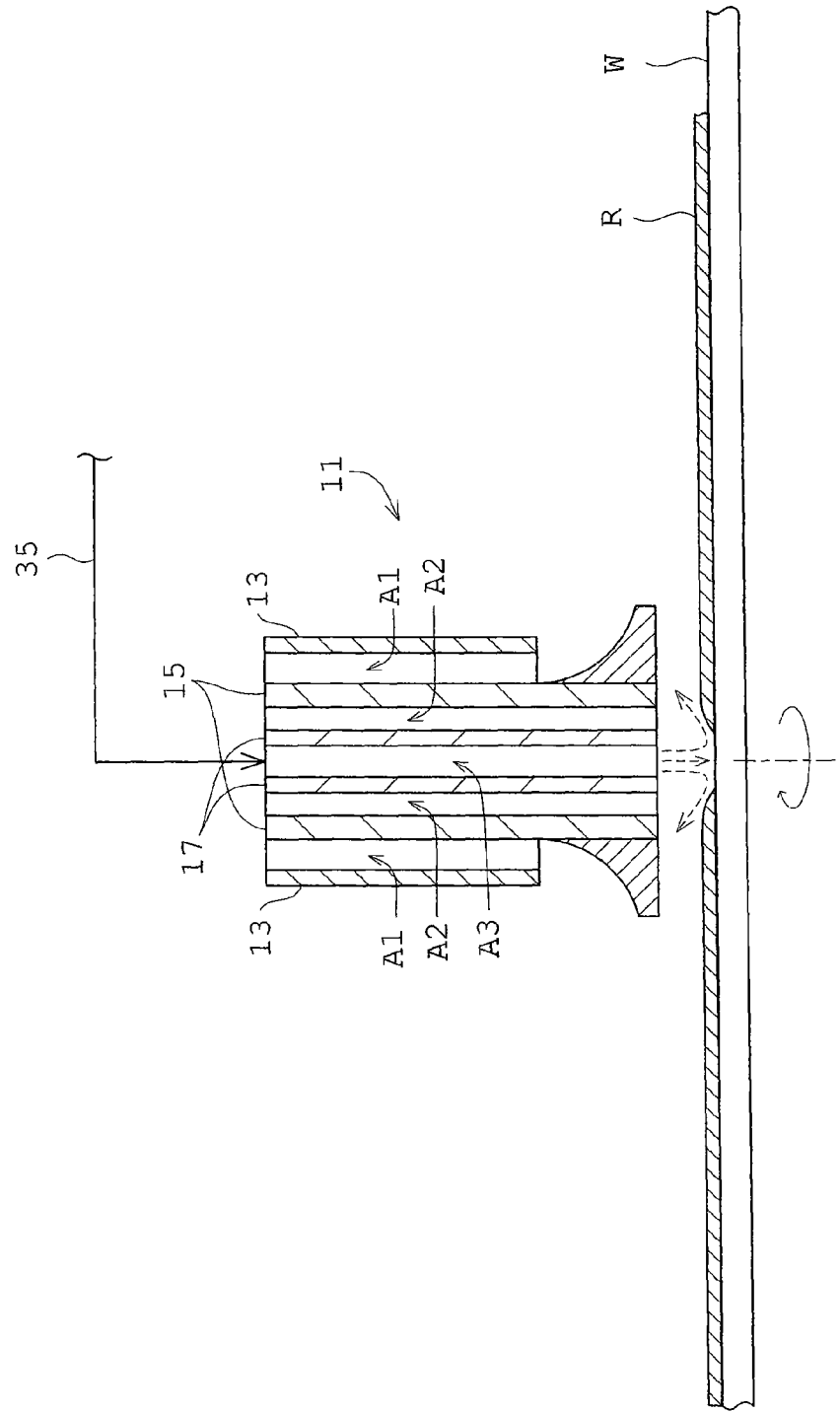
FIG. 8 is a schematic view showing a state of starting supply of nitrogen gas from the joint nozzle to the substrate.

FIG. 8 is a schematic view showing a state of starting supply of the nitrogen gas from the joint nozzle 11 to the wafer W. As seen, the nitrogen gas jetted blows away the surfactant solution, breaking its film R adjacent the spin center C of the wafer W. The part adjacent the spin center C where the film R of the surfactant solution is broken dries.

Figure 9:
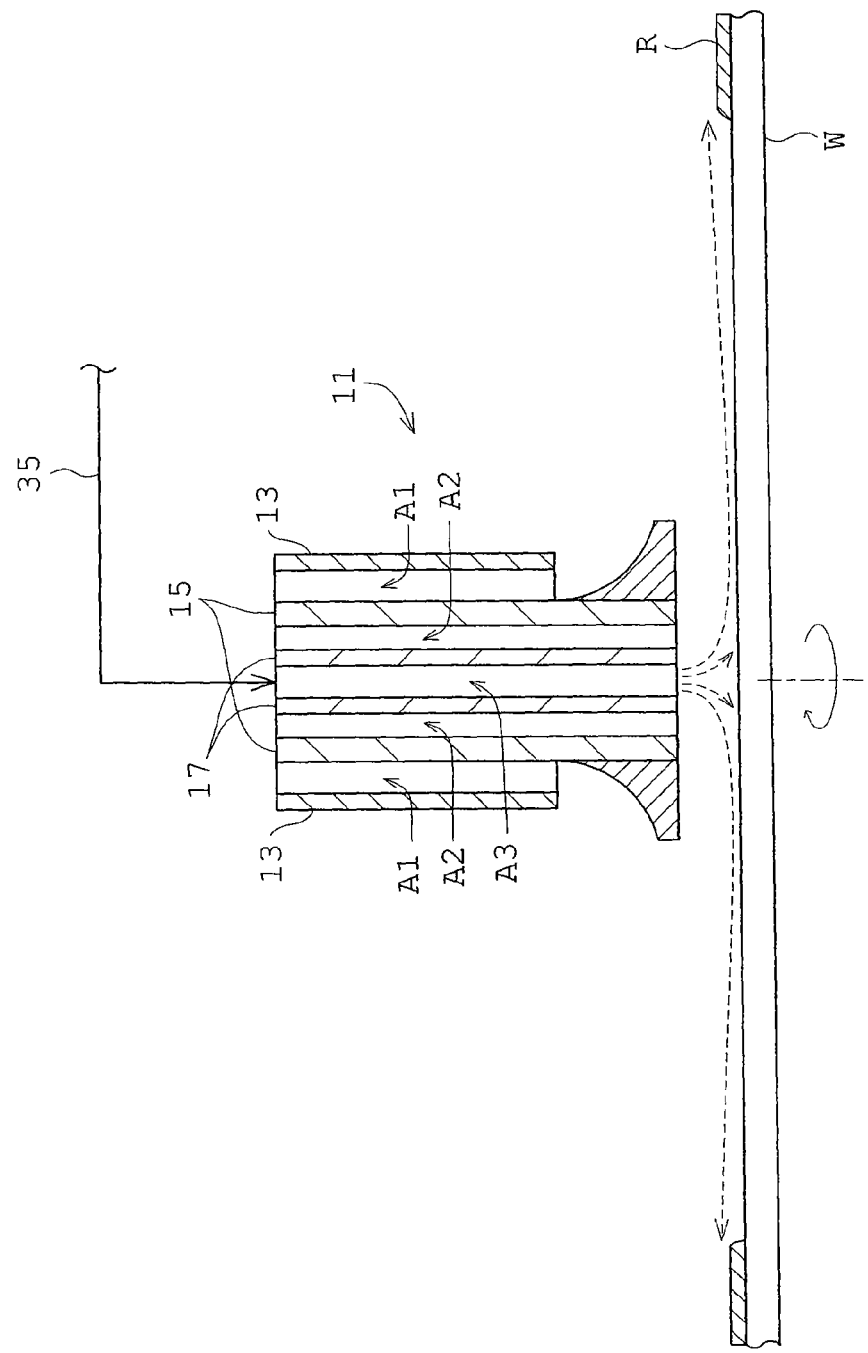
FIG. 9 is a schematic view showing a state of starting supply of nitrogen gas from the joint nozzle to the substrate.

Further, as shown in FIG. 9, once the film R of the surfactant solution is broken, the broken part enlarges quickly outward over the wafer W, and the dried part also spreads quickly. In this way, the entire wafer W is dried.

As drying progresses at a stretch, the wafer W changes from the state of having the film R of rinsing liquid formed thereon straight to the dried state. This allows no time for formation of droplets of the surfactant solution. Even if droplets of the surfactant solution are formed, the droplets can be scattered away from the wafer W by the centrifugal force produced by the spinning wafer W and the wind pressure of the nitrogen gas.

The wafer W is dried until time t5 to complete the drying process.

As described above, the developing apparatus in this embodiment has the joint nozzle 11 for delivering the developer, rinsing liquid and nitrogen gas. The different liquids and gas to be supplied to adjacent the spin center C of the wafer W may be switched instantly only be opening and closing the electromagnetism switch valves 25, 33a, 33b and 39 while the joint nozzle 11 is maintained still adjacent the spin center C of the wafer W in plan view.

Specifically, deionized water can be supplied immediately after stopping the supply of the developer, thereby terminating the development reaction. This enables the developer to be supplied until just before the end of the developing process as in this embodiment. Consequently, the rate of the development reaction does not fall to the last. Since the period of the developing process can be shortened, the time taken to perform entire developing treatment can be shortened. Further, the development reaction can be stopped instantly by using a desired timing of switching from the developer to deionized water. It is thus possible to perform proper development to obtain a developed pattern of desired line width.

Since nitrogen gas is jetted immediately after stopping supply of the surfactant solution, the wafer W can be dried quickly and directly from the state of having the film R of the surfactant solution on the wafer W. This can inhibit formation of droplets of the surfactant solution even when the wafer W has a large angle of contact under the influence of photoresist film, so that the surfactant solution tends to form droplets. As a result, the surfactant solution does not remain on the wafer W long enough for the components of resist to melt into the surfactant solution. There is no possibility of forming post-develop defects due to deposits of the components of resist present on the dried wafer W.

Even when droplets of the surfactant solution are formed on the wafer W, the droplets of the surfactant solution may be scattered away from the wafer W by the centrifugal force produced by the spinning wafer W and the wind pressure of the nitrogen gas.

Since the joint nozzle 11 is located adjacent the spin center C of the wafer W in plan view, various gas and liquids can be delivered substantially at right angles to the surface of wafer W. Consequently, the various liquids can be supplied to the wafer W so as to spread in concentric circles from adjacent the spin center C of the wafer W. The drying of the wafer W by nitrogen gas may also progress in concentric circles from adjacent the spin center C.

The joint nozzle 11 is swingable by the single arm 47 and single second motor 49, which simplifies the construction of the developing apparatus.

The surfactant solution supplied to the wafer W in the rinsing process has a relatively weak surface tension. Thus, the surfactant solution having entered the developed pattern is not scattered away or will never pull the developed pattern when drying. This prevents falling of the developed pattern, called a pattern collapse, occurring during the drying process.

The temperature control of the rinsing liquid in the second space A2 of the joint nozzle 11 can suppress variations and extensions of the time required for the drying process. This inhibits post-develop defects caused by dissolution of resist components.

The developer and rinsing liquid are subjected to the temperature control by the single, common temperature control device consisting of the housing 41 and Peltier device 43. This arrangement can simplify the construction compared with the case where separate temperature control devices are provided.

The joint nozzle 11 having the liquid baffle 19 can cause the developer to reach the wafer W smoothly.

In time of starting the developing process, the developer is delivered while the joint nozzle 11 is swung from the standby pot (not shown) to adjacent the spin center C of the wafer W in plan view. Thus, the developer is first supplied to the edges of the wafer W. This inhibits generation of micro bubbles involved into the developer landing on the wafer W, compared with the case of starting the supply of the developer at the center of the wafer W.

This invention is not limited to the foregoing embodiment, but may be modified as follows:

(1) The foregoing embodiment includes the joint nozzle 11 for delivering the developer, rinsing liquid and nitrogen gas. The invention is not limited to such construction.

Figure 10:
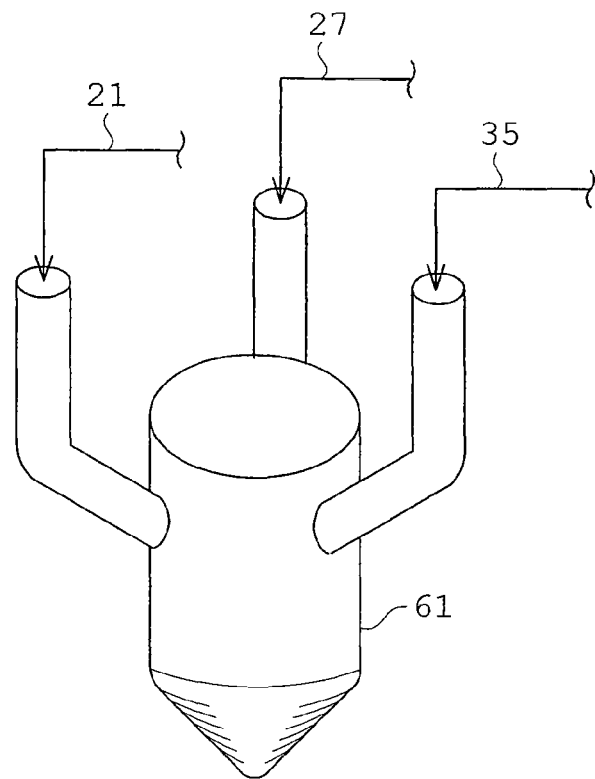
FIG. 10 is a perspective view of a nozzle in a modified embodiment.

As shown in FIG. 10, for example, a joint nozzle 61 may include a single cylindrical body defining a single discharge opening in a lower position thereof. As seen, the developer piping 21, rinsing liquid piping 27 and nitrogen gas piping 35 are connected to upper positions of the joint nozzle 61, and the respective liquids and gas are delivered from the common discharge opening.

Figure 11:
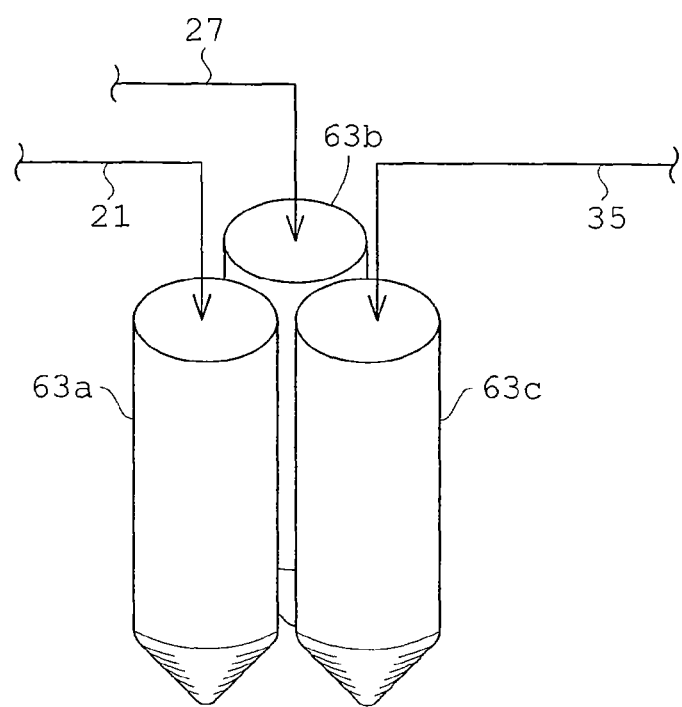
FIG. 11 is a perspective view of nozzles in another modified embodiment.

As shown in FIG. 11, a developer nozzle 63a, a rinsing liquid nozzle 63b and a nitrogen gas nozzle 63c may be provided separately for the respective liquids and gas. In this case also, a single arm may be provided for holding the developer nozzle 63a, rinsing liquid nozzle 63b and nitrogen gas nozzle 63c collectively. Alternatively, three separate arms may be provided for holding the developer nozzle 63a, rinsing liquid nozzle 63b and nitrogen gas nozzle 63c individually.

The second motor 49 described in the foregoing embodiment may be applied to the single arm or to the separate arms, but the following modification is possible. In the foregoing embodiment, the nozzle 11 swung to adjacent the spin center C of the wafer W in plan view is made to stand still there. The developer nozzle 63a, rinsing liquid nozzle 63b and nitrogen gas nozzle 63c swung to adjacent the spin center C may be further moved or rotated within a range adjacent the spin center C of the wafer W in plan view. This further movement is a movement to a position where the discharge opening of at least one of the nozzles 63a, 63b and 63c held adjacent the spin center C is directed to the spin center C of the wafer W. The distance of this movement is about 20-30 mm, for example. The further rotation is a displacement to direct the discharge opening of at least one of the nozzles 63a, 63b and 63c held adjacent the spin center C to the spin center C of the wafer W. The movement or rotation of the nozzles 63a, 63b and 63c within a range adjacent the spin center C of the wafer W in plan view will be referred to hereinafter simply as "slight movement" to distinguish from the swinging movement in the foregoing embodiment.

Figure 12A:
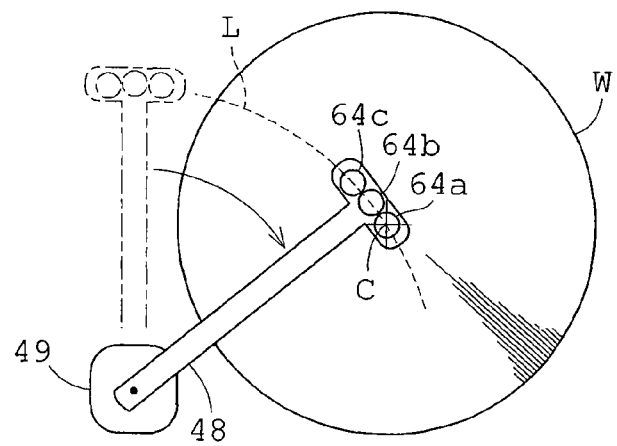
FIGS. 12A, 12B and 12C are plan views of a principal portion of a modified developing apparatus.
Figure 12B:
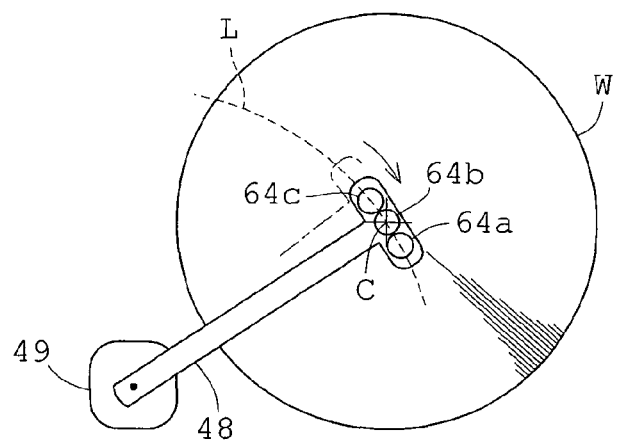
Figure 12C:
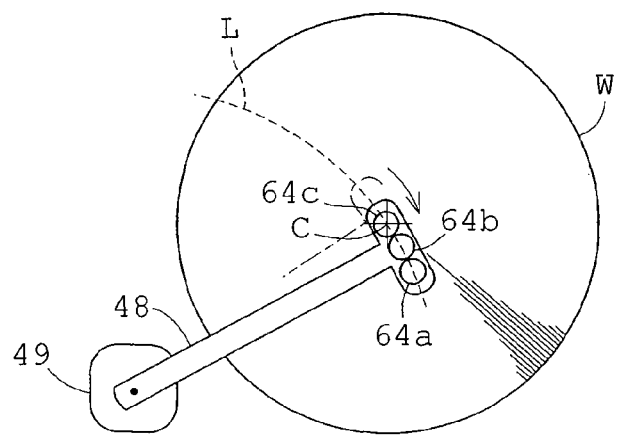

The slight movement will be described with reference to FIGS. 12A-12C. FIGS. 12A-12C are plan views of a principal portion of a modified developing apparatus. A developer nozzle 64a, a rinsing liquid nozzle 64b and a nitrogen gas nozzle 64c are held together by a single arm 48 to be close to one another and located on a swing track L. The discharge openings of the nozzles 64a, 64b and 64c are directed straight downward. The second motor 49 is connected to a proximal end of the single arm 48. The single arm 48 and second motor 49 correspond to the driving device in this invention.

A controller not shown operates the second motor 49 to swing the nozzles 64a, 64b and 64c together from a standby position (shown in alternate long and short dash lines in FIG. 12A) offset from a position over the wafer W to adjacent the spin center C of the wafer W, and at the same time causes the developer to be delivered from the developer nozzle 64*a*. The swing of the single arm 48 is stopped when the developer nozzle 64*a* arrives at a position over the spin center C of the wafer W (position shown in solid lines in FIG. 12A). Consequently, the developer is supplied to the spin center C of the wafer W. When switching from this developing process to the rinsing process, the controller operates the second motor 49 to swing the single arm 48 slightly, whereby the rinsing liquid nozzle 64*b* is moved to and maintained still in the position over the spin center C of the wafer W (position shown in solid lines in FIG. 12B). This slight swing corresponds to the slight movement noted above. Consequently, the rinsing liquid is supplied to the spin center C of the wafer W. When switching from the rinsing process to the drying process, the controller again operates the second motor 49 to move the single arm 48 slightly, whereby the nitrogen gas nozzle 64*c* is moved to and maintained still in the position over the spin center C of the wafer W (position shown in solid lines in FIG. 12C). Consequently, nitrogen gas is supplied to the spin center C of the wafer W. Thus, also where the plurality of nozzles 64*a*, 64*b* and 64*c* for supplying the different types of liquid and gas, the developer, rinsing liquid and nitrogen gas may be supplied to the spin center C of the wafer W by slightly moving the nozzles adjacent the spin center C of the wafer W. The switching between the different types of liquid and gas to be supplied can be carried out quickly through slight swinging movements. Thus, this modification realizes a similar effect to the foregoing embodiment. Since the nozzles 64*a*, 64*b* and 64*c* are moved slightly together, the apparatus has a simplified construction, and the control by the controller is never complicated.

The construction for slightly moving a plurality of nozzles is not limited to the modified embodiment described with reference to FIG. 12. For example, the developer nozzle 63*a*, rinsing liquid nozzle 63*b* and nitrogen gas nozzle 63*c* may be moved and/or rotated slightly together by a common actuator provided separately from the second motor 49. This common actuator may be disposed at the tip of the above single arm 48, or any other appropriate positions of the single arm 48.

The nozzles 63*a*, 63*b* and 63*c* may be moved slightly and separately from one another by an actuator for the developer, an actuator for the rinsing liquid and an actuator for the nitrogen gas. These actuator for the developer, actuator for the rinsing liquid and actuator for the nitrogen gas may be arranged at the tip of a single drive mechanism, or may be arranged in any appropriate positions of separate arms.

The nozzles 63*a*, 63*b* and 63*c* may be moved slightly within a range adjacent the spin center C of the wafer W in plan view (e.g. within a range of about 20-30 mm) in accordance with actual timing of supplying the liquids and gas, so that the discharge openings of the nozzles 63*a*, 63*b* and 63*c* are opposed to the spin center C of the wafer W in order.

The single arm 49 or separate arms to which at least one of the common actuator, the actuator for the developer, actuator for the rinsing liquid and actuator for the nitrogen gas is/are connected correspond(s) to the driving device in this invention.

The above driving device may be applied also to the joint nozzle 11 described in the foregoing embodiment, to move the joint nozzle 11 slightly adjacent the spin center C of the wafer W in accordance with timing of supplying the liquids and gas, so that the liquid and gas discharge openings of the joint nozzle 11 are opposed to the spin center C of the wafer W.

Figure 13:
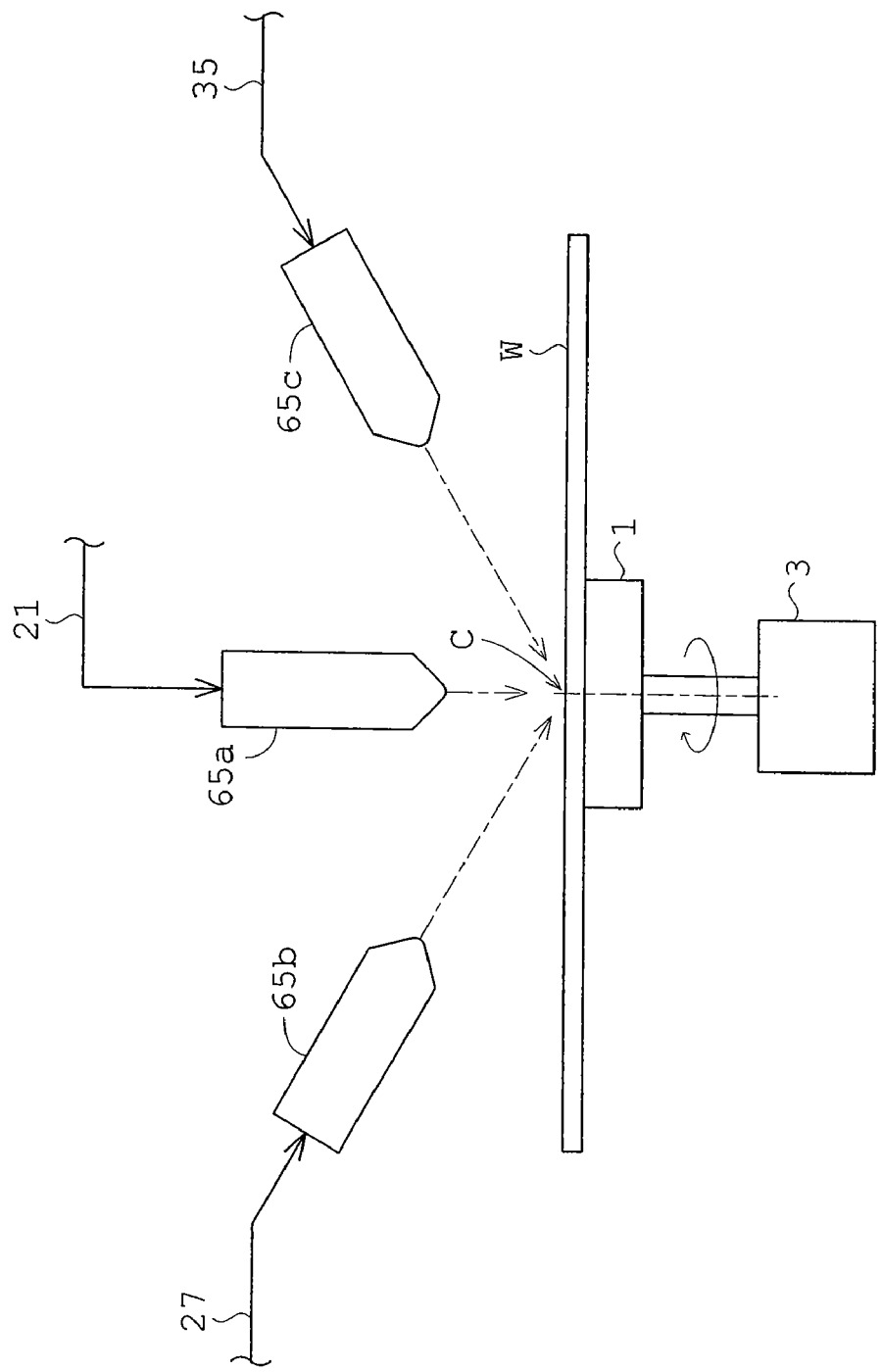
FIG. 13 is a front view showing positions of modified nozzles.

(2) In the foregoing embodiment, the joint nozzle 11 is located adjacent the spin center C of the wafer W in plan view, but the position of the nozzle is not limited to this. As shown in FIG. 13, a developer nozzle 65*a*, a rinsing liquid nozzle 65*b* and a nitrogen gas nozzle 65*c* may be arranged separately in positions displaced from adjacent the spin center C of the wafer W in plan view. Each of the nozzles 65*a*, 65*b* and 65*c* has a discharge opening directed to adjacent the spin center C of the wafer W. The liquids and gas are supplied from obliquely upward positions toward the spin center C of the wafer W.

(3) In the foregoing embodiment, the period for supplying nitrogen gas in the dry process may be changed as appropriate. That is, nitrogen gas may be supplied from time t4 till time t5 when the drying process ends, or for only a short period from time t4.

(4) While nitrogen gas is supplied in the foregoing embodiment, any inert gas, not limited to nitrogen gas, may be used.

(5) In the foregoing embodiment, the supply of the developer is continued in the developing process while spinning the wafer W. This is not limitative. The developing process may employ the puddle development mode as in the prior art. That is, a developing process may be carried out by forming a puddle of the developer on the wafer W, and thereafter maintaining the wafer W with the puddle formed thereon still until the developing process is completed. In this way also, it is possible to prevent generation of post-develop defects due to a large angle of contact of the wafer W.

(6) In the foregoing embodiment, deionized water is supplied to the wafer W in the first half of the rinsing process, and the surfactant solution in the second half. This is not limitative. For example, the surfactant solution may be supplied constantly throughout the rinsing process. Alternatively, deionized water and a surfactant may be supplied in parallel, thereby forming a surfactant solution on the wafer W.

(7) The temperature control device in the foregoing embodiment is what is called electronic cold heat having the housing 41 and Peltier device 43. This may be replaced with a different known temperature control device as appropriate.

This invention may be embodied in other specific forms without departing from the spirit or essential attributes thereof and, accordingly, reference should be made to the appended claims, rather than to the foregoing specification, as indicating the scope of the invention.

What is claimed is:

1. A developing apparatus for developing a substrate, comprising:
   a spin-support device for rotatably supporting the substrate;
   a developer nozzle for supplying a developer to the substrate;
   a rinsing liquid nozzle for supplying a rinsing liquid to the substrate;
   an inert gas nozzle for supplying an inert gas to the substrate;
   wherein said developer nozzle is integrated with said rinsing liquid nozzle and said inert gas nozzle; and
   a control device programmed for controlling spinning of the substrate and supply of the developer, the rinsing liquid and the inert gas;
   wherein said rinsing liquid nozzle and said inert gas nozzle are juxtaposed in a position adjacent a spin center of the substrate in plan view, and
   wherein said control device starts supplying the inert gas to adjacent the spin center after supplying the rinsing liquid to adjacent the spin center of the substrate being spun, and while a film of the rinsing liquid is present on the substrate, whereby the supplied inert gas breaks the film of the rinsing liquid.

2. An apparatus as defined in claim 1, further comprising a driving device for slightly moving said inert gas nozzle adjacent the spin center of the substrate in plan view.

3. An apparatus as defined in claim 2, wherein said driving device is arranged to move slightly also said rinsing liquid nozzle adjacent the spin center of the substrate in plan view.

4. An apparatus as defined in claim 3, wherein said driving device is arranged to move slightly also said developer nozzle adjacent the spin center of the substrate in plan view.

5. An apparatus as defined in claim 1, wherein:
   said developer nozzle is juxtaposed with said rinsing liquid nozzle in said position adjacent the spin center of the substrate in plan view when said rinsing liquid nozzle is disposed adjacent the spin center of the substrate in plan view; and
   said control device is arranged, while spinning the substrate, to switch instantly from the supply of the developer to adjacent the spin center to the supply of the rinsing liquid to adjacent the spin center.

6. An apparatus as defined in claim 1, wherein said rinsing liquid nozzle and said inert gas nozzle are integrated with each other.

7. An apparatus as defined in claim 1, wherein the rinsing liquid is a solution including a surfactant.

8. An apparatus as defined in claim 1, further comprising a temperature control device disposed around said developer nozzle and said rinsing liquid nozzle for adjusting temperature of both the developer in said developer nozzle and the rinsing liquid in said rinsing liquid nozzle.

9. A developing apparatus for developing a substrate, comprising:
   a spin-support device for rotatably supporting the substrate;
   a developer nozzle for supplying a developer to the substrate;
   a rinsing liquid nozzle for supplying a rinsing liquid to the substrate;
   an inert gas nozzle for supplying an inert gas to the substrate;
   wherein said developer nozzle is integrated with said rinsing liquid nozzle and said inert gas nozzle; and
   a control device programmed for controlling spinning of the substrate and supply of the developer, the rinsing liquid and the inert gas;
   wherein said rinsing liquid nozzle and said inert gas nozzle are mutually separated but both directed to a position adjacent a spin center of the substrate, and
   wherein said control device starts supplying the inert gas to adjacent the spin center after supplying the rinsing liquid to adjacent the spin center of the substrate being spun, and while a film of the rinsing liquid is present on the substrate, whereby the supplied inert gas breaks the film of the rinsing liquid.

10. An apparatus as defined in claim 9, wherein:
    said developer nozzle is also directed to said position adjacent the spin center of the substrate when said rinsing liquid nozzle is directed to said position adjacent the spin center of the substrate; and
    said control device is arranged, while spinning the substrate, to switch instantly from the supply of the developer to adjacent the spin center to the supply of the rinsing liquid to adjacent the spin center.

11. An apparatus as defined in claim 9, wherein said rinsing liquid nozzle and said inert gas nozzle are integrated with each other.

12. An apparatus as defined in claim 9, wherein the rinsing liquid is a solution including a surfactant.

13. An apparatus as defined in claim 9, further comprising a temperature control device disposed around said developer nozzle and said rinsing liquid nozzle for adjusting temperature of both the developer in said developer nozzle and the rinsing liquid in said rinsing liquid nozzle.

* * * * *